United States Patent [19]
McCabe et al.

[11] Patent Number: 5,960,638
[45] Date of Patent: Oct. 5, 1999

[54] MODULAR ENVIRONMENTAL CONTROL UNIT FOR CLEANROOMS

[75] Inventors: Chuck K. McCabe, Mission Viejo, Calif.; Greg A. Marvell, Lake Oswego, Oreg.

[73] Assignee: Huntair Inc., Tigard, Oreg.

[21] Appl. No.: 08/912,213

[22] Filed: Aug. 15, 1997

[51] Int. Cl.⁶ .............................. F25D 17/06; B01L 1/04
[52] U.S. Cl. .................................. 62/90; 62/258; 62/436; 165/47; 454/187
[58] Field of Search .................................. 62/92, 99, 201, 62/FOR 436, FOR 435, 258; 454/187; 165/FOR 47

[56] References Cited

U.S. PATENT DOCUMENTS

| | | | |
|---|---|---|---|
| 5,022,231 | 6/1991 | Martinez, Jr. ................................ | 62/99 |
| 5,069,113 | 12/1991 | Martson et al. .................... | 454/187 X |
| 5,425,503 | 6/1995 | Corso ...................................... | 62/201 X |
| 5,701,950 | 12/1997 | Imamura et al. ........................ | 62/92 X |

*Primary Examiner*—William Wayner
*Attorney, Agent, or Firm*—Miller, Nash, Wiener, Hager & Carlsen LLP

[57] ABSTRACT

This patent discloses a modular environmental control system for small cleanroom enclosures ("mini-enclosures"). Small environmental control units ("ECUs") are mounted on top of individual mini-enclosures, as near as possible to the process tool within the enclosure. Each ECU has the capability of controlling temperature, humidity, and airflow rate delivered into the enclosure. Temperature is adjusted by first cooling the air inside the ECU followed by reheating it to a selected temperature. The cooling capability is not generated by individual ECUs. Instead, a remote fluid cooling unit supplies chilled fluid to each ECU, which is circulated internally to cool the air. The same remote unit services different ECUs at the same time.

7 Claims, 7 Drawing Sheets

MODULAR ENVIRONMENTAL CONTROL UNIT FOR CLEANROOMS

TECHNICAL FIELD

The invention disclosed in this document generally relates to cleanrooms which are used in silicon chip manufacturing operations. More particularly, the invention relates to air delivery systems for controlling the environment inside cleanrooms.

BACKGROUND INFORMATION

The semiconductor manufacturing industry uses small cleanroom enclosures ("mini-enclosures") for many different kinds of manufacturing operations. Inside the mini-enclosures are process tools such as photo process, stepper, ebeam, measurement, wet station, CMP, and others. The manufacturing operations require high precision and have a low tolerance to contaminants. It is necessary to maintain constant environmental conditions inside the enclosure and minimize variations in temperature, humidity, volumetric airflow, etc. It is much easier to precisely control the environment inside a mini-enclosure because of its smaller interior space or volume. For this reason, mini-enclosures are now used throughout the semiconductor manufacturing industry.

Stand-alone environmental control units are typically used to control mini-enclosure temperature, humidity, and air flow rates. This is illustrated in FIG. 3, which shows a typical prior art stand-alone installation at 1.

The unit 1 is physically spaced apart from a mini-enclosure 2 at a distance that will vary from one manufacturing facility to the next. The unit 1 draws surrounding ambient air, cools or heats it, as necessary, and adjusts its humidity. The volumetric flow rate through the unit 1 is controlled by an adjustment to the fan 3.

As shown at 5, conditioned air is driven by the fan 3 through a duct 6 and filter 7, and then into the mini-enclosure 2. Temperature and humidity sensors 8 are positioned at or near the point of airflow entry into the enclosure. The sensors provide continual feedback to a controller (indicated generally at 9) in the stand-alone unit 1. The controller 9 causes the unit to adjust temperature and humidity based on sensor feedback.

The ambient air temperature outside the duct 6 can be significantly different from the temperature of the conditioned air 5. Also, even though the system is typically located in a controlled, air-conditioned space inside a building, the ambient air temperature can vary significantly. Heat transfer from the ambient air can alter the temperature and relative humidity of the air 5 as it exits the unit 1 and travels through the duct 6. Consequently, while it is possible to control airflow conditions at the point where the conditioned air 5 exits the unit 1 and enters the duct 6, the impact of the duct introduces inconsistent and uncontrollable variations in the airflow. The longer the duct 6, the greater the problem.

The physical dimensions and weight of the typical unit 1 make it impossible, as a practical matter, to eliminate the duct 6 by mounting the unit directly on top of an enclosure 2. The stand-alone unit 1 has its own internal air conditioning unit which cools or otherwise sets the temperature of the air 5. In part, the size and weight of the internal air conditioning unit limits the ability to make design changes to the unit 1.

Moreover, the internal air conditioning unit uses an operating fluid to produce conditioned air via a conventional refrigeration cycle. The fluid undergoes a phase change during compression and expansion portions of the cycle. The different portions of the cycle are never absolutely constant which produces rapid temperature fluctuations within a narrow range. What this means is that working fluid temperatures produced by the phase change are difficult to maintain at a consistent level with ultra-high precision.

The present invention addresses the above drawbacks and provides certain improvements. Among other things, the invention eliminates the internal air conditioning unit described above. This, in turn, allows a much smaller environmental control unit to be designed. In fact, the environmental control unit disclosed here can be reduced in size so that a typical mini-enclosure can physically support the weight of the unit. This permits direct mounting of the unit to the enclosure and moves the point of temperature and humidity control to the point of air entry into the enclosure. The invention also provides a better system for producing highly stable temperature and humidity control.

SUMMARY OF THE INVENTION

The invention is a system for providing environmental control capability to one or more mini-enclosure cleanrooms at the same time. A chilled fluid (e.g. chilled water) is produced at a single location by a fluid cooling unit in a semi-conductor manufacturing facility. A number of mini-enclosure cleanrooms are also located in the same facility. The fluid is distributed by a piping network from the fluid cooling unit to each enclosure.

Each enclosure has its own environmental control unit ("ECU") mounted on top of the enclosure. Each ECU is constructed as a modular unit that has a relatively small "footprint." The small size of the ECU enables the enclosure to support the weight of the ECU. It is preferred that, in each case, the ECU is mounted directly above or as close as possible to the fabrication tool or other machinery inside the enclosure ("process tool").

Each ECU operates independently of the other. Therefore, each ECU draws ambient air from the environment surrounding the enclosure and adjusts air temperature and humidity to within selected parameters prior to delivery to the process tool.

Each ECU has a rectangular case or housing with an air inlet and an air outlet. Housed within the case is a cooling coil unit that is positioned near the inlet. As air enters the ECU, it passes over individual coils making up the cooling unit. The chilled fluid delivered to the ECU is circulated through the coils and cools the air to a point that is below a certain set point. Thereafter, the air passes through a reheat unit that is also inside the ECU case but downstream of the cooling coil unit. The reheat unit raises the air temperature to the set point desired for delivery into the enclosure.

Each ECU also has a humidifier unit inside the case. The humidifier unit generates water vapor and introduces it into the airstream prior to delivery into the enclosure.

Each ECU has its own variable frequency drive ("VFD") and fan. The fan draws the air through the ECU and pushes it through the ECU outlet into the enclosure.

The various parts of the invention as summarized above will become better understood after reviewing the following detailed description which is to be read in conjunction with the drawings.

BRIEF DESCRIPTION OF THE DRAWINGS

In the drawings, like reference numerals and letters refer to like parts throughout the various views, and wherein.

BEST MODE FOR CARRYING OUT THE INVENTION

Figure 1:
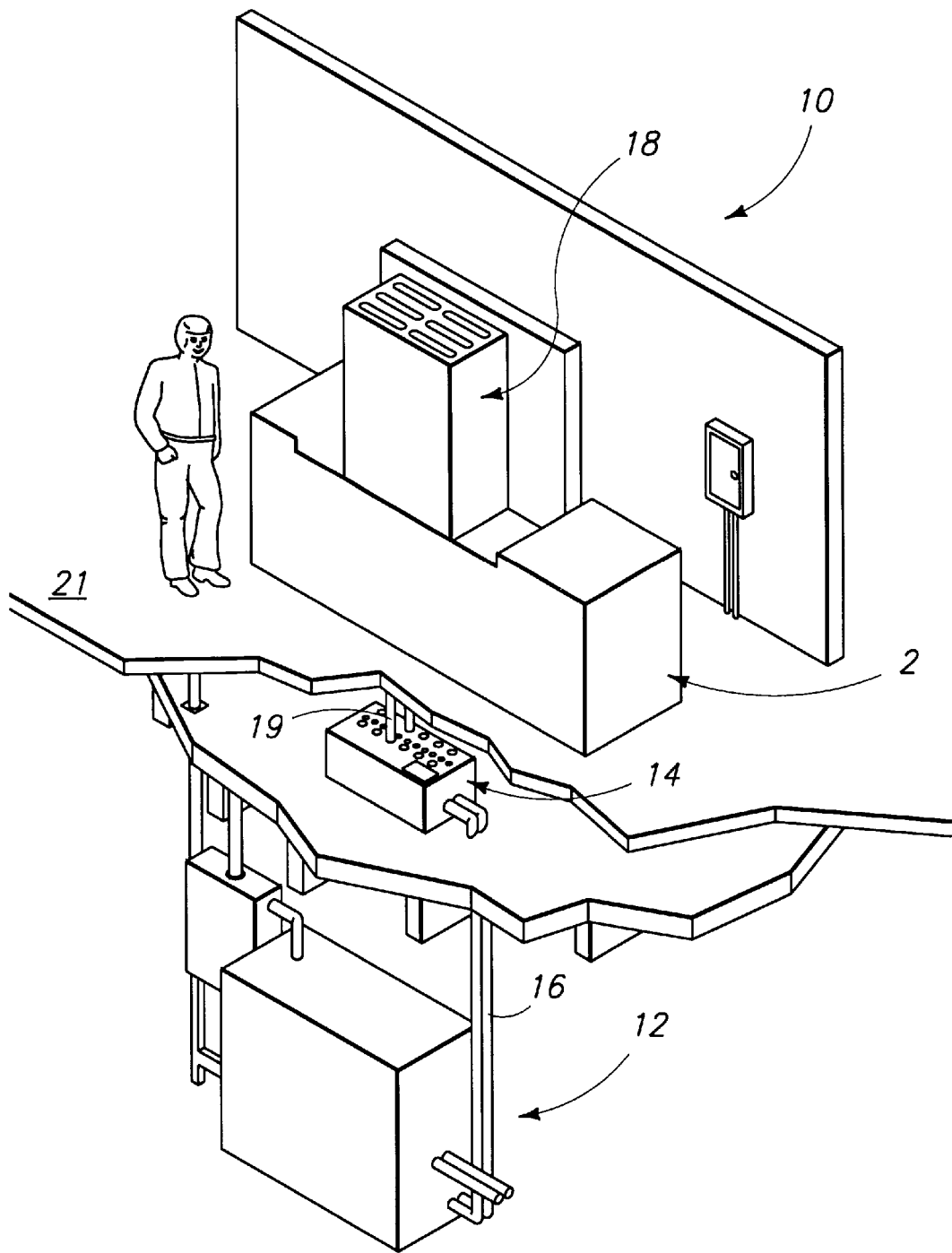
FIG. 1 is a pictorial view of a cooling system constructed in accordance with the present invention.

Referring to FIG. 1, shown generally at 10 is an environmental control system constructed in accordance with a preferred embodiment of the invention. Part of the system 10 includes a fluid cooling unit ("FCU"), indicated generally at 12. The FCU 12 chills an operating fluid (typically, water with a small amount of glycol for antifreeze purposes). The output temperature of the chilled fluid is controllable. Basically, the FCU 12 produces chilled fluid at a temperature that is lower than the dewpoint of either the ambient air ("supply air") drawn from the surrounding environment into an ECU (described in detail later) or the control air delivered by an ECU into an enclosure, like the enclosure 2 shown in FIG. 1. Generally speaking, the temperature of the operating or chilled fluid will be within 5 degrees of 35 degrees Fahrenheit. The type and capacity of the FCU 12 will depend on the specific configuration of the system, but mainly, it will depend on the number of cleanroom enclosures 2 (and type of process tools) operating in a particular area or facility.

The FCU 12 delivers chilled fluid to a coolant distribution unit ("CDU") 14 by way of an insulated pipe network 16. The CDU 14 supplies the chilled fluid to individual environmental control units ("ECU") (see 18 in FIG. 1), each of which is constructed in accordance with the invention.

Figure 8:
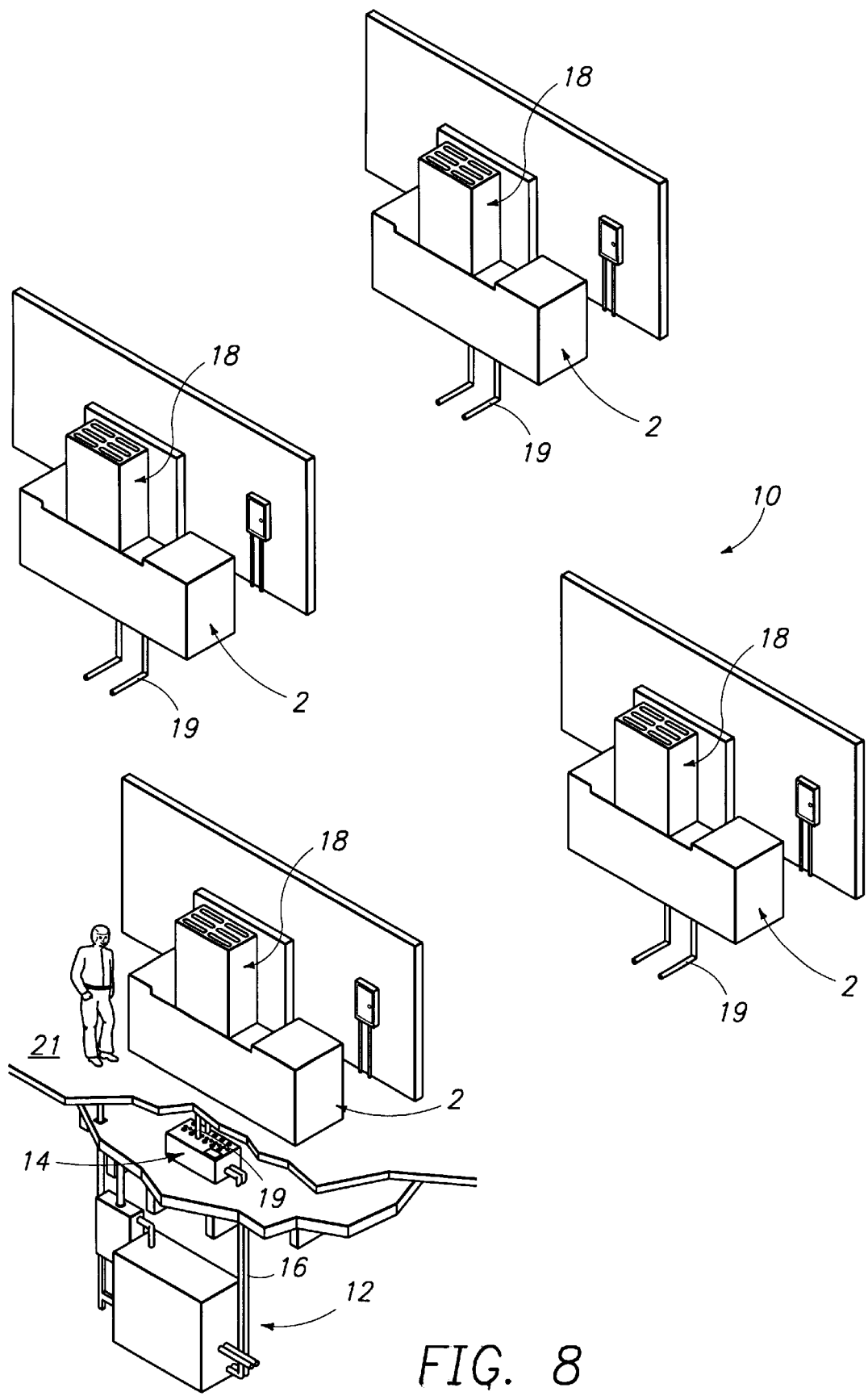
FIG. 8 is a view like FIG. 1, but illustrates multiple ECU and enclosure systems.

FIG. 1 shows a single ECU 18 mounted on top of an enclosure 2. It is to be understood, however, that the system 10 includes multiples of the enclosure 2 and ECU 18 configurations, as shown in FIG. 8. The precise number will vary, depending on the manufacturing facility. In some cases, different enclosure and ECU configurations will be used corresponding to the particular manufacturing operation in the enclosure. The CDU 14 distributes chilled fluid to all of the ECUs from the FCU 12. The fluid is distributed through a piping network 19. Basically, the CDU 14 must be designed to operate as a distribution manifold that is custom-configured to the facility. A person skilled in the art would know how to build and custom configure the CDU.

As seen in FIGS. 1 and 8, the FCU 12 is remotely located from the enclosures and ECUs 2, 18. The FCU 12 could be in the basement of a building, for example. The CDU 14 could be located below a false floor 21 in a manufacturing facility. Referring now to FIGS. 4–7, the construction of each ECU 18 will now be described.

Figure 4:
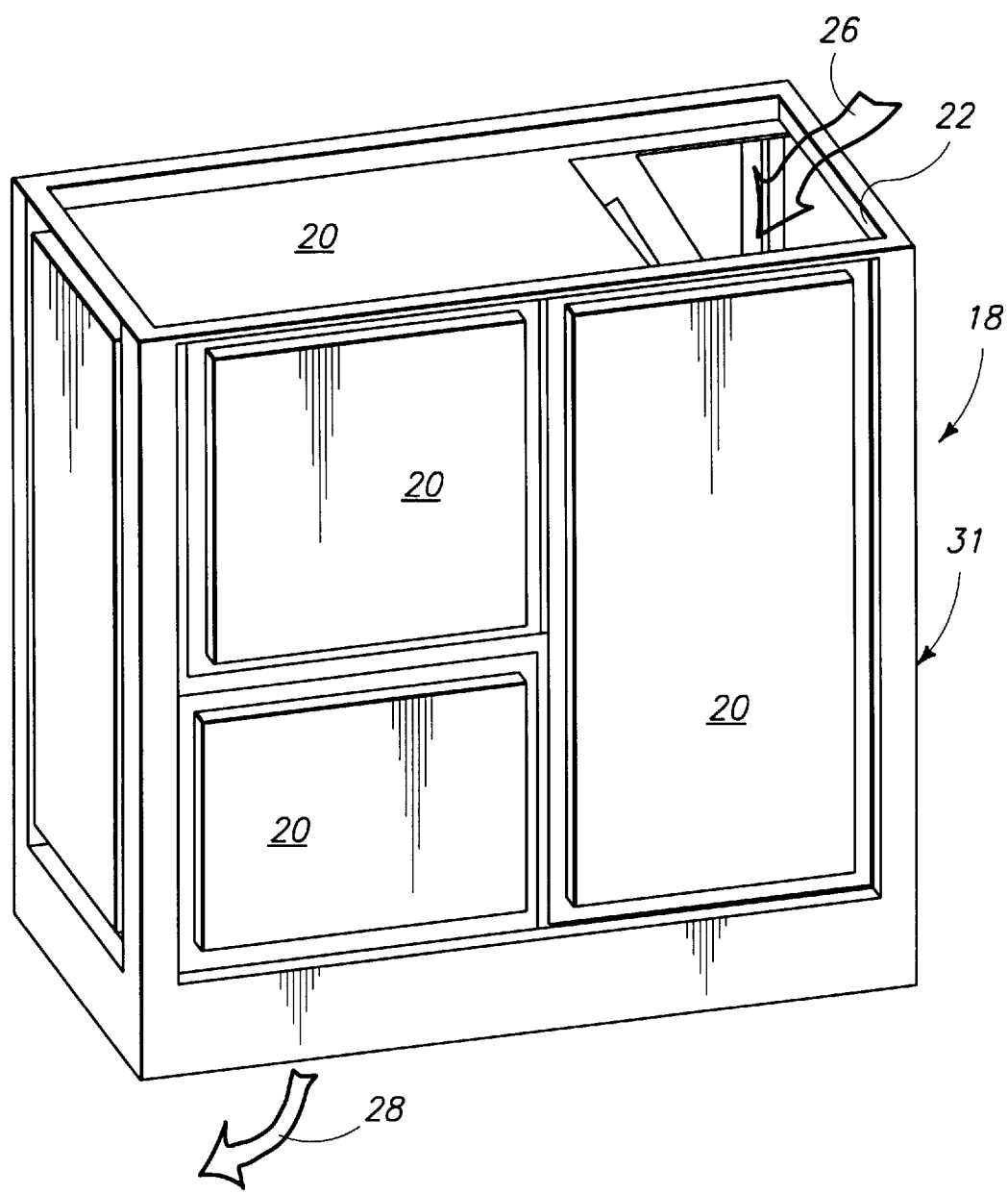
FIG. 4 is a pictorial view of a modular environmental control unit ("ECU") constructed in accordance with a preferred embodiment of the invention.
Figure 5:
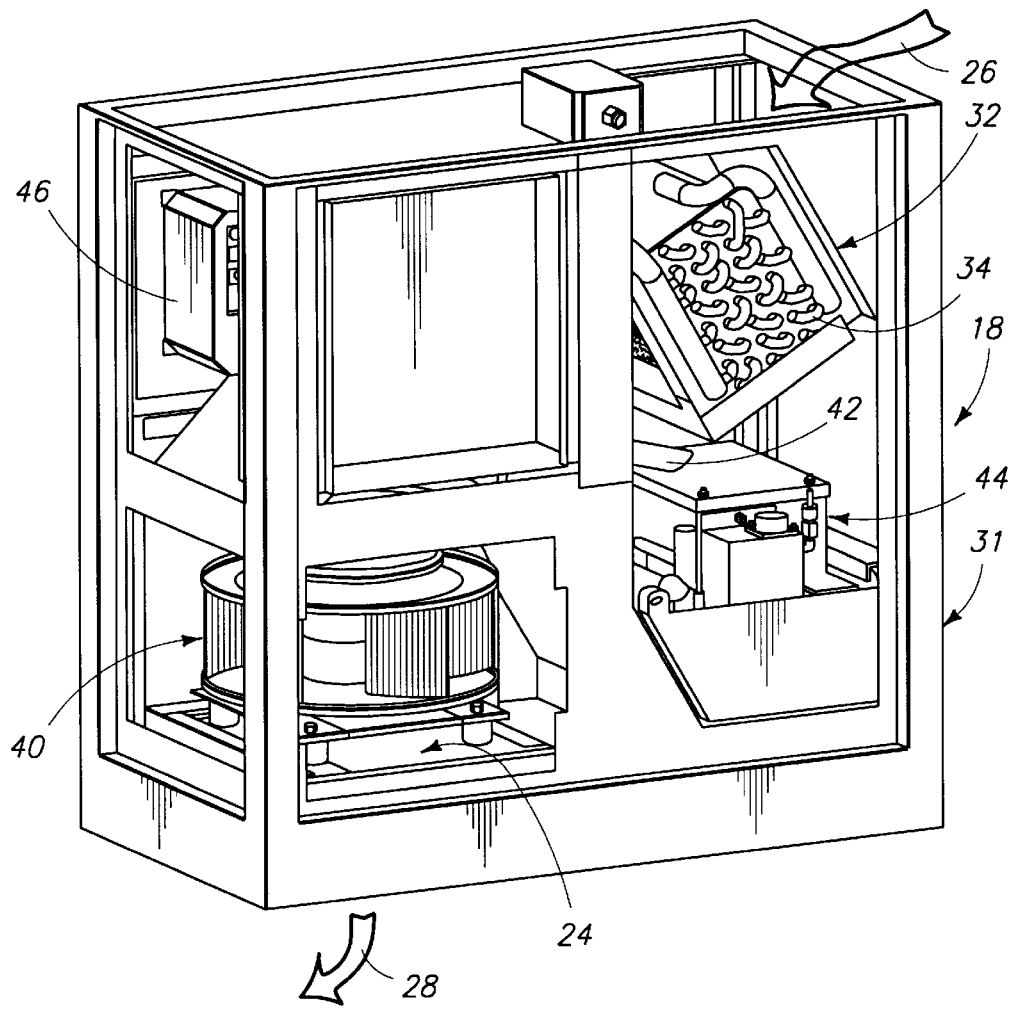
FIG. 5 is a view like FIG. 4, but with the outer panels of the ECU removed.
Figure 6:
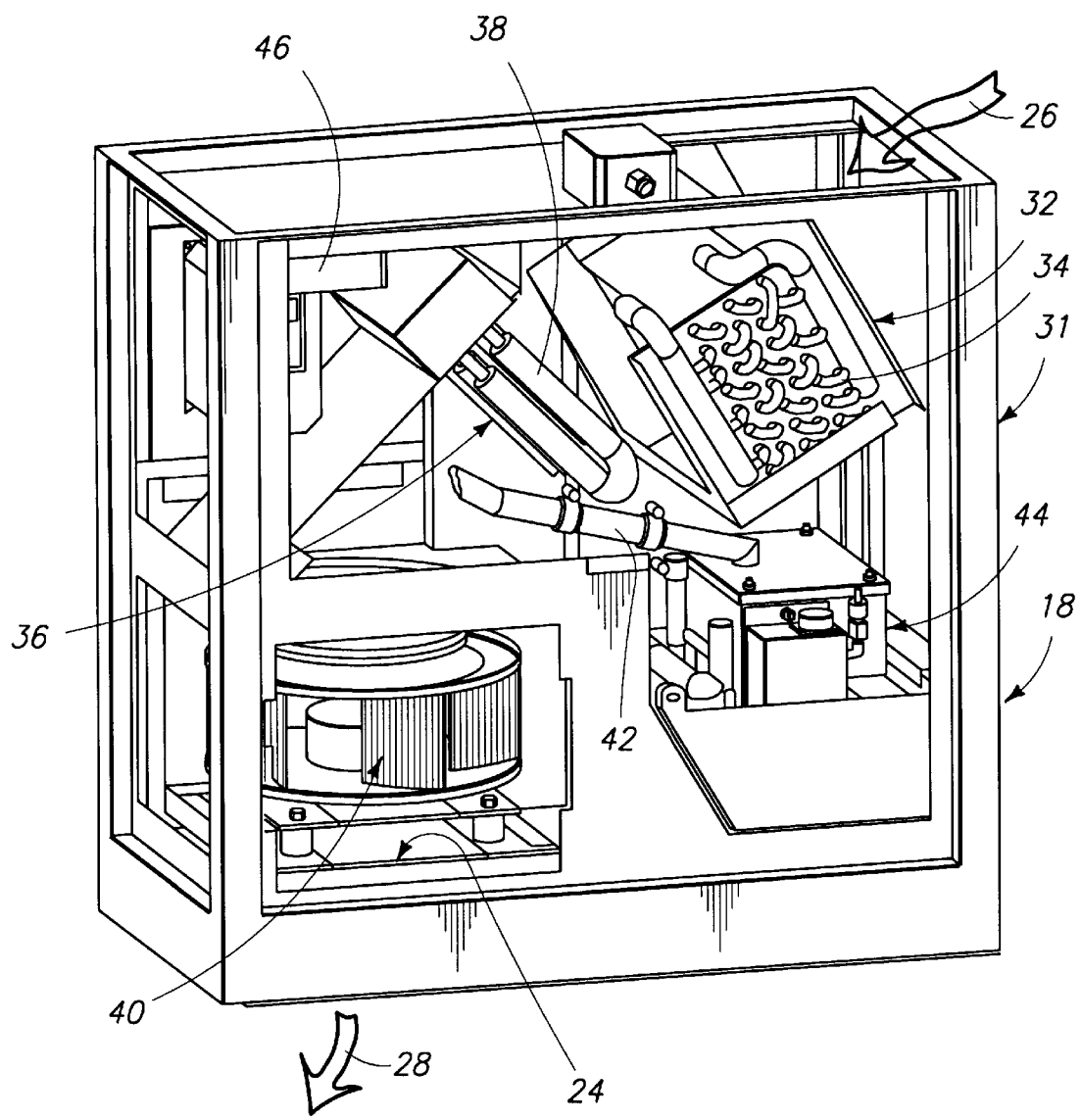
FIG. 6 is a view like FIG. 5.
Figure 7:
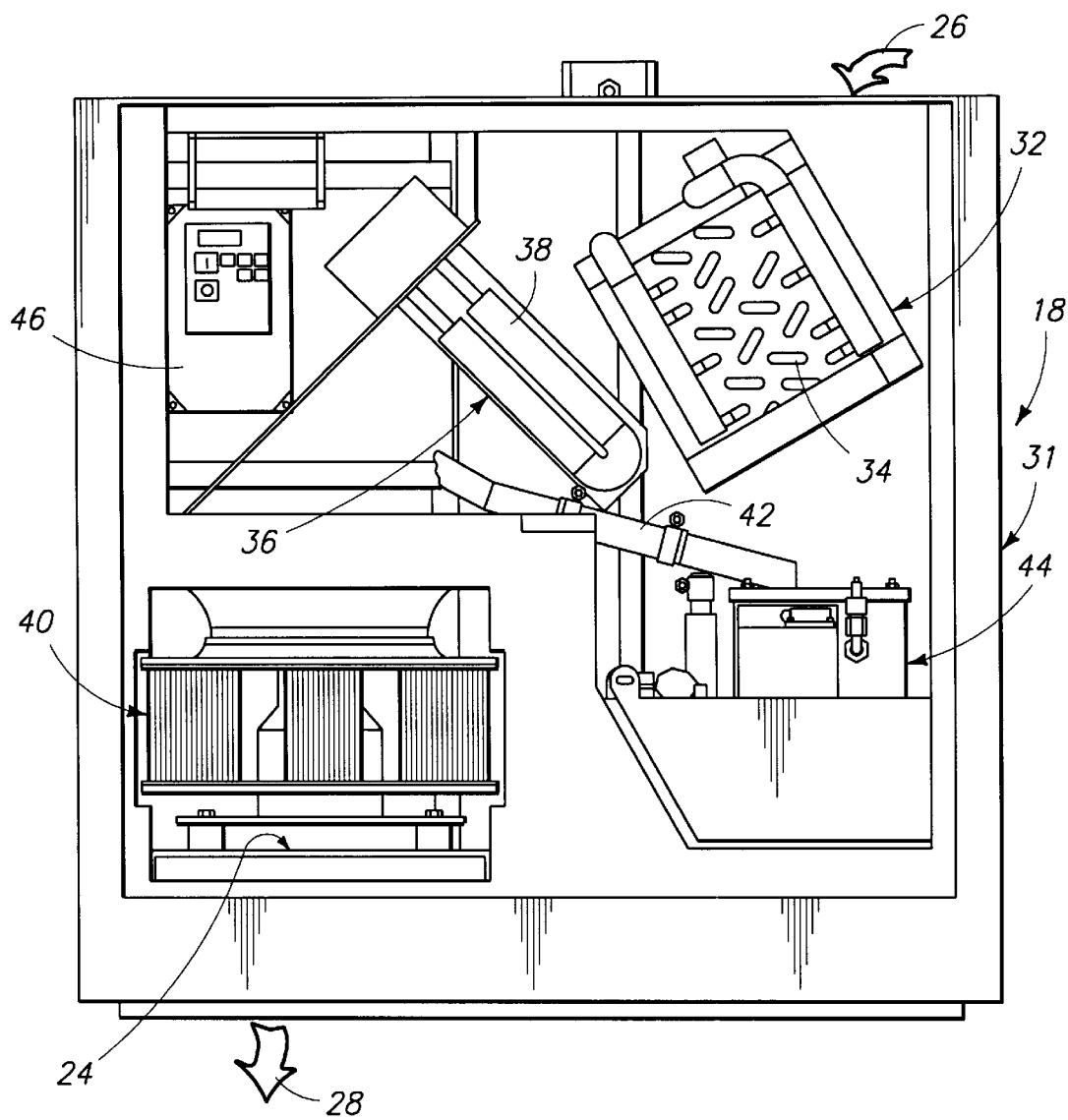
FIG. 7 is a side view of the ECU shown in FIGS. 4–6.

Each ECU 18 has a rectangular housing, the precise dimensions of which may vary depending on the type of enclosure 2 or process tool. FIG. 4 shows the outer surface of the case. The case is enclosed and sealed by panels 20 on all sides, with the exception of an air inlet and outlet. The inlet is indicated at 22. The outlet cannot be seen in FIG. 4. because it is on the underside of the ECU 18. Its location is shown at 24 in FIGS. 57. The direction of airflow as it enters the ECU 18 is shown at 26 in FIG. 6. The direction of the airflow exiting the ECU 18 is shown at 28 in the same Figure.

The inlet air 26 is called the "supply" air, because it is ambient air taken from the surrounding airspace in the facilities area where the enclosures and ECUs 2, 18 are located. This will probably always be in an air-conditioned area. The exit air is called the "control" air because it is delivered into the enclosure 2 within very precise parameters. For example, it may be a requirement that the control air be maintained within 0.1 degrees Centigrade and 0.5 percent relative humidity with respect to preset temperature and humidity set points.

While it is not shown in the drawings, because it is not germane to what is claimed here as the invention, a filter may be placed across the inlet 22. A high-quality ULPA filter will be placed across the outlet 24. The appropriate filters to use are well known in the industry.

Figure 3:
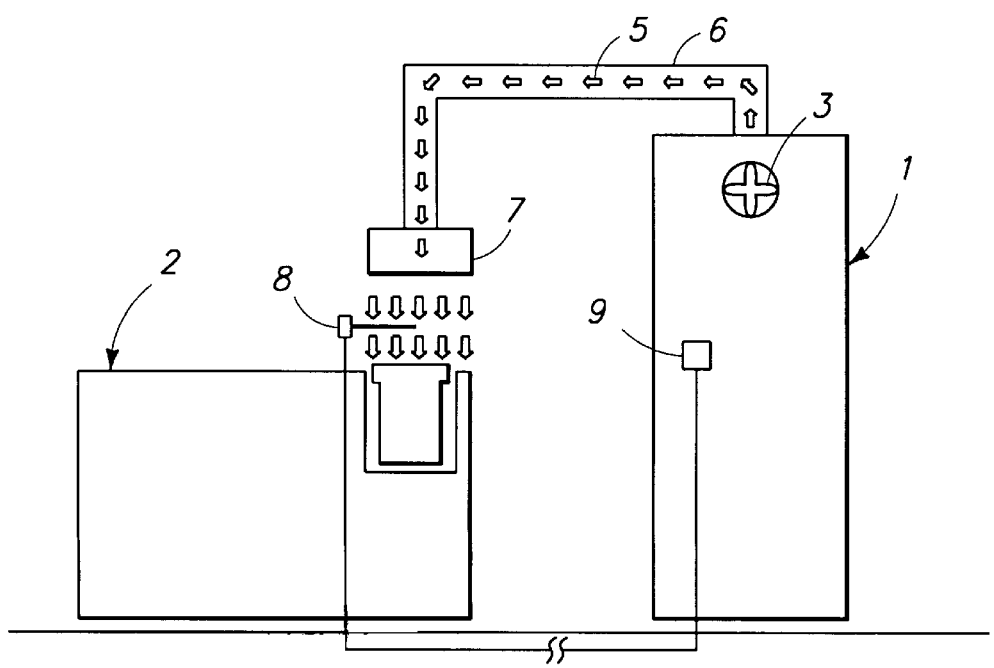
FIG. 3 is a schematic view similar to FIG. 2, but shows a prior art stand-alone environmental control unit connected to a mini-enclosure.

Each ECU 18 is mounted to the enclosure 2 so that the outlet 24 is as near to the fabrication tool as possible. Like the prior art example described above, there will be temperature and humidity sensors 30 (see FIG. 3) positioned within the enclosure 2 that will continually provide feedback for the ECU 18.

Positioned within the framework 31 of the ECU case are a number of components which enable temperature and humidity control of the airstream passing through the ECU. Positioned near the inlet 22 is a cooling coil unit 32. Unit 32 contains individual cooling coils 34 in which chilled fluid received from the FCU and CDU 12, 14 is circulated. The construction of the unit 32 is conventional, and it is possible to obtain the unit from any number of manufacturers. Its dimensions have to be customized to fit the envelope of the frame 31. Otherwise, the surface area and number of coils in the unit 32 will be determined solely on the basis of desired cooling capacity, which is a matter of standard engineering principles.

The airstream passes from the inlet 26 through the cooling coil unit 32 and then crosses a downstream reheat unit 36. The reheat unit 36 consists of finned tubular heating elements 38 which provide low watt density heating. These elements are also conventional in construction and can be obtained from a number of sources.

The air is drawn through the ECU 18 by a variable frequency drive ("VFD") and fan 40. Like the cooling and heating units 32, 36 just described, the fan 40 is typical in construction and can be obtained from any number of sources.

In between the reheat unit 36 and fan 40 is a humidifier outlet 42. The outlet 42 introduces vapor into the airflow from a humidifier unit 44 prior to exit of the airflow 8 from the ECU 18 as shown at 28. A person skilled in the art will be familiar with the type of humidifier units used in stand-alone systems (see 1 in FIG. 3). However, the preferred unit is constructed in accordance with the specifications disclosed in U.S. patent application Ser. No. 08/857,868, filed May 16, 1997, the disclosure of which is expressly incorporated herein by reference.

Figure 2:
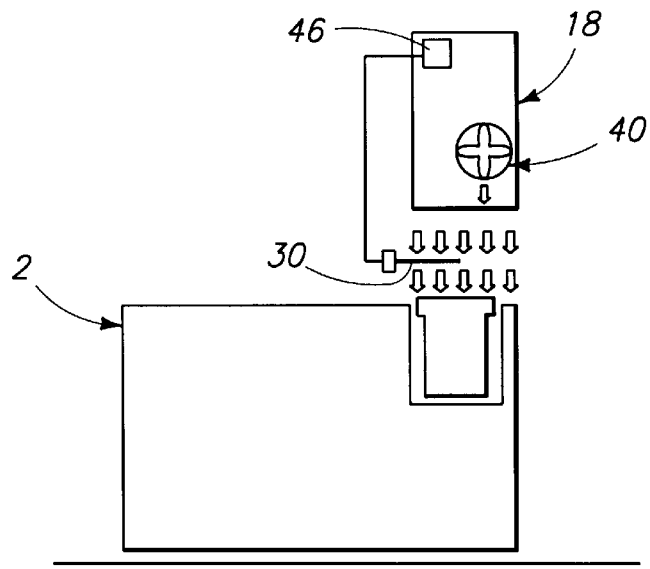
FIG. 2 is a side schematic view of an environmental control system constructed in accordance with the present invention.

In operation, the sensor(s) 30 (see FIG. 2) monitors the temperature and humidity of the control air as it exits the ECU 18 and enters the enclosure 2. As a skilled person would understand, the specific sensor configuration may vary. However, in all cases, a temperature and humidity feedback signal is provided to a control unit 46 in the ECU 18. Depending on the feedback signal, the control unit 46 adjusts the output of the humidifier 44 and reheat unit 36 to meet preselected levels.

It was previously indicated that an advantage of the present invention is that there is no phase change of a cooling fluid in order to provide control air into the enclosure 2 at the desired temperature. In other words, and referring again to the prior art system shown in FIG. 3, the old stand-alone system 1 uses a conventional, internal air conditioning unit which provides cooling via compression and expansion of a cooling fluid along with a change in phase. While this type of cooling is well-known, it is difficult to control with extremely high precision.

Since each ECU 18 relies on the FCU 12 for cooling via supply of chilled fluid to the coils 34 and in the coolant unit 18, the mechanical complexity and size of a conventional internal air conditioning unit is eliminated from the system 10. The ECU chilling unit 34 is smaller and lower in weight. The heating unit 36 is also small and relatively light. Together they provide a system that can be packaged in a much smaller volume. Moreover, by eliminating use of the typical refrigeration cycle, the ECU 18 largely minimizes or eliminates the kind of fluctuations described above. The cooling coil unit 32 reduces air temperature to a level that is very constant and will not fluctuate rapidly, because the temperature of the chilled fluid delivered by the FCU 12 will not change quickly. The reheat unit 36 simply adds heat to the air, as necessary, to bring its temperature back up to the desired level. This arrangement attenuates the impact of enthalpy content on temperature fluctuations.

The power supply and control of the fan 40 is provided via a conventional VFD controller. Likewise, the power supply and control of the reheat unit 36 is conventional. The control logic used to control fan speed or respectively adjust the heat and vapor output of the reheat unit 36 and humidifier 44 is conventional and would be easy to implement by those skilled in the art.

It is to be understood that the invention is not to be limited to the specific embodiment described above. Reasonable changes and new improvements to the invention may be made in the future. Consequently, the scope of the invention is to be limited solely by the following patent claims.

What is claimed is:

1. An environmental control system for providing simultaneous environmental control to a plurality of cleanroom enclosures operating in the same cleanroom environment, comprising:

a fluid coolant unit ("FCU") for producing a chilled liquid fluid at a remote location relative to each cleanroom enclosure;

a plurality of modular environmental control units ("ECUs"), each ECU being mounted to a cleanroom enclosure immediately above a process tool within the enclosure, and further, each unit is adapted to draw ambient air from the environment surrounding the cleanroom enclosure, adjust at least the temperature of the air to within preselected parameters, and deliver the air into the enclosure near the process tool, and wherein each ECU is adapted to receive and use the chilled liquid fluid received from the FCU to control the temperature of the air delivered to the tool.

2. The environmental control system of claim 1, including:

a coolant distribution unit ("CDU"), interconnecting the FCU and the ECUs, for distributing chilled fluid to the ECUs.

3. The environmental control system of claim 1, wherein each ECU includes:

a cooling coil unit near an air inlet, the cooling coil unit being positioned in a manner so that ambient air drawn from outside the ECU is directed in and through the unit;

a reheat unit positioned downstream of the cooling coil unit in a manner so that air which exits the cooling coil unit is directed to the reheat coil unit;

a humidifier unit, the humidifier unit having an outlet which introduces vapor into the air downstream of the reheat unit; and a fan positioned in the ECU for drawing air through the ECU and delivering the air into the enclosure near the process tool.

4. A modular environmental control unit ("ECU") for mounting immediately above a process tool within a cleanroom enclosure, comprising:

a rectangular case having an air inlet and an air outlet;

a liquid cooling coil unit positioned inside the case near the air inlet in a manner so that an airstream passing into the ECU is directed in and through the unit;

a reheat unit positioned inside the case downstream of the cooling coil unit in a manner so that the airstream exiting the cooling coil unit is directed through the reheat unit;

a humidifier unit positioned inside the case but outside the airstream, the humidifier unit being characterized in that it is capable of generating a vapor stream, and further, the humidifier unit being arranged within the case in a manner so that the humidifier unit can introduce a stream of vapor into the airstream; and a fan positioned inside the case for drawing the airstream through the ECU from the inlet to the outlet.

5. The ECU of claim 4, wherein the humidifier unit introduces vapor into the airstream downstream of the reheat unit.

6. The method of claim 4, wherein each ECU is adapted to control the temperature, humidity, and flow rate of the air delivered to its respective enclosure.

7. A method for simultaneously controlling the environment inside a plurality of cleanroom enclosures, comprising:

producing a chilled liquid fluid at a centralized location that is remote relative to the location of each cleanroom enclosure;

providing each cleanroom enclosure with a modular environmental control unit ("ECU"), each ECU being mounted to an enclosure immediately above a process tool that is within the enclosure for conditioning air near the point of entry into the cleanroom enclosure, and further, each ECU being adapted to draw ambient air from the environment surrounding the cleanroom enclosure, adjust at least the temperature of the air to within preselected parameters, and then deliver the air into the enclosure near the tool;

distributing chilled liquid fluid from the remote location to the ECUs; and having each ECU use the chilled liquid fluid in connection with adjusting the temperature of the air delivered to the tool.

* * * * *